United States Patent [19]
Mignardi et al.

[11] Patent Number: 5,393,706
[45] Date of Patent: Feb. 28, 1995

[54] INTEGRATED PARTIAL SAWING PROCESS

[75] Inventors: Michael A. Mignardi, Dallas; Rafael C. Alfaro, Carrollton, both of Tex.

[73] Assignee: Texas Instruments Incorporated, Dallas, Tex.

[21] Appl. No.: 1,378

[22] Filed: Jan. 7, 1993

[51] Int. Cl.⁶ .......................................... H01L 21/302
[52] U.S. Cl. ................................. 437/226; 437/227; 148/DIG. 28
[58] Field of Search ............... 437/226, 227, 229, 225, 437/209, 901, 927; 148/DIG. 28

[56] References Cited

U.S. PATENT DOCUMENTS

| | | | |
|---|---|---|---|
| 4,904,610 | 2/1990 | Shyr | 437/209 |
| 4,997,792 | 3/1991 | McClurg | 437/225 |
| 5,238,876 | 8/1993 | Takeuchi et al. | 437/173 |
| 5,266,528 | 11/1993 | Yamada | 148/DIG. 28 |

FOREIGN PATENT DOCUMENTS

| | | | |
|---|---|---|---|
| 54-12563 | 1/1979 | Japan | 437/227 |
| 56-78137 | 6/1981 | Japan | 437/227 |
| 57-52143 | 3/1982 | Japan | 437/205 |
| 59-186345 | 10/1984 | Japan | 437/227 |
| 3-236258 | 10/1991 | Japan | 437/226 |
| 4-139856 | 5/1992 | Japan | 437/226 |

Primary Examiner—Brian E. Hearn
Assistant Examiner—Michael Trinh
Attorney, Agent, or Firm—Julie L. Reed; James C. Kesterson; Richard L. Donaldson

[57] ABSTRACT

A process for partially sawing the streets on semiconductor wafers. After sawing the streets can be covered by a protective material, and then the wafer continues its processing as before. After the wafer is broken, the protective material may or may not be removed. Additionally, the wafer may be broken into individual chips using a wedge piece that has a number of individual wedges on it, where the individual wedges press against the partially sawn streets, causing the wafer to break.

5 Claims, 4 Drawing Sheets

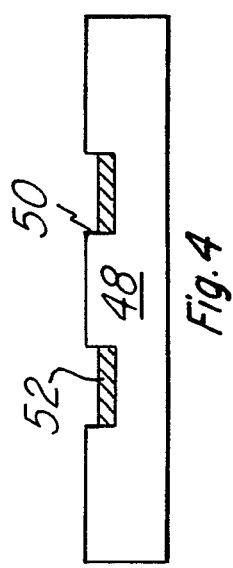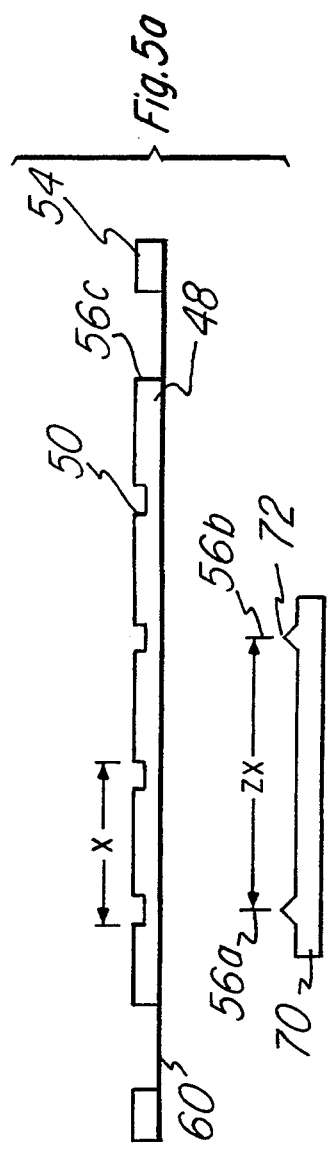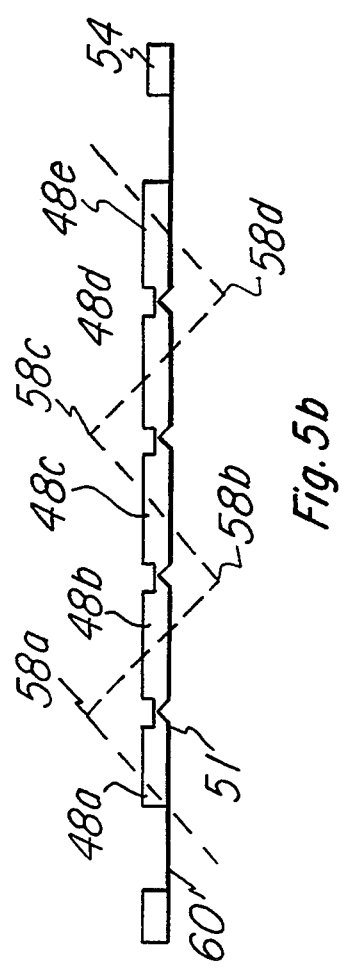

INTEGRATED PARTIAL SAWING PROCESS

BACKGROUND OF THE INVENTION

1. Field of the Invention

This invention relates to semiconductor processing more particularly to saw and cleaning operations.

2. Background of the Invention

Multilayered devices, such as micromachines, that are built on semiconductor wafers are becoming more common. Many of these require processing of sacrificial layers or similar processes that are better done while the individual chili tire still in wafer form.

However, many problems with contaminants and debris arise if the processing is done before dicing the wafer into separate chips. For example, if the wafer is processed to remove a sacrificial or protective layer used in the earlier stage of the process, when the wafer is divided into chips, debris from the division can come in contact with the surfaces previously protected or covered by the sacrificial layer.

Another option is to divide the wafer first, then finish any processes that remove sacrificial or protective layers on the individual chips. Depending on the process, and the carriers used for the process, this can be prohibitively time-consuming, labor-intensive and very expensive.

Therefore, there exists a need for a method or process that allows processing to be done in wafer form in such a manner to eliminate or limit contact between the debris caused by dividing the wafer, while not requiting large amounts of time.

SUMMARY OF THE INVENTION

The present invention disclosed herein comprises a method of processing semiconductor wafers that eliminates contact between protected/covered surfaces and debris from wafer division. One embodiment of the method comprises mounting the wafer on a saw frame, partially sawing the streets between the chips on the wafer, covering the streets with a protective tape or caulk, completing the remaining processes on the wafer, breaking the wafer, and then picking and placing the individual chips off the saw frame.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 4 shows a side view of a wafer with protective caulking in partially sawed streets.

FIGS. 5a and 5b show a side view of a wafer on a saw frame with partially sawed streets and a possible breaking pattern for the wafer.

DETAILED DESCRIPTION OF THE PREFERRED EMBODIMENTS

Figure 1:
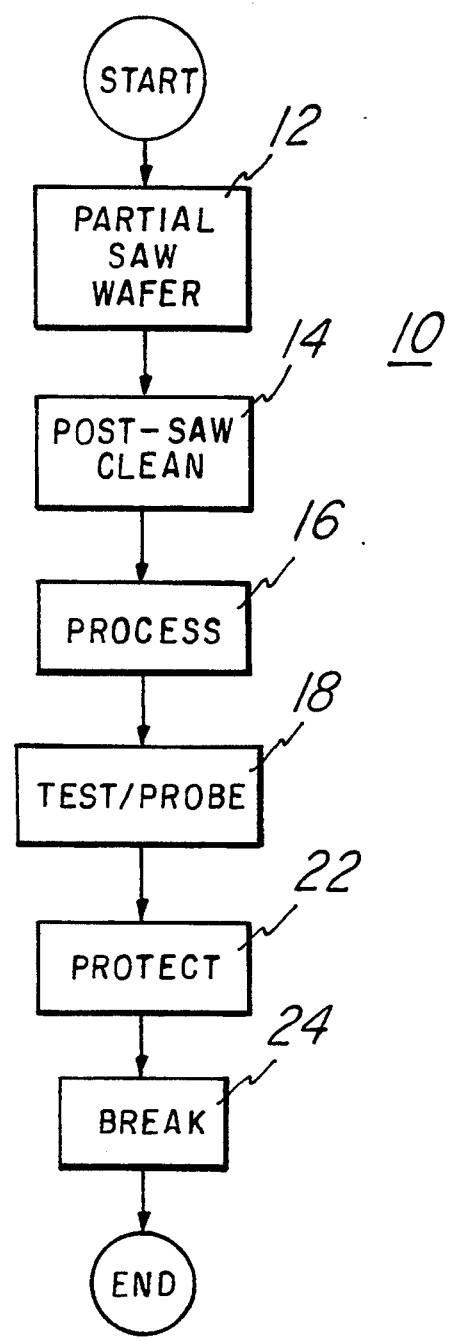
FIG. 1 shows a flow chart of one embodiment from partial saw to removing individual chips.

FIG. 1 shows an overall process flow 10 for a semiconductor wafer that can be adapted to use a protective tape or caulking in the streets between the chips. The process starts after all of the processes are completed that are specific to that micromachine or multilayered structure. For example, addressing circuitry or actuators may be put down or implanted into the substrate. Then a layer of polymer or other sacrificial material can be laid down on top of the circuitry or actuators. This layer can be hardened and processed to support posts or spokes for micromechanical structures that require freedom of movement from the actuator layer. After the supports are in place, the material for the active part of the micromachine follows. Whether or not the final layer is patterned or patterned and etched before beginning the process in FIG. 1 is a process choice left to the user.

Therefore, at the point in which this process will most likely be used, there is a multilayered semiconductor structure with its protective for sacrificial layers intact, on each chip on the wafer. The process in FIG. 1 begins at step 12 with a partial saw or diamond scribe over the streets on the wafer. It may be desirable to put removable protective coating over the entire wafer before sawing to further limit debris from the partial saw or scribe from settling on the important device features. The thickness of the material left behind in the streets depends on the substrate material, further handling constraints, and the process designer's choice of breaking apart the chips. When the actual sawing or scribing occurs, the wafer will be mounted upon a standard saw frame.

In step 14, the protective coating, if used, and the debris from the partial saw, is removed in a post-saw cleaning. The removal may be a wet process, depending on the material used as a protective coat. One example could be a resist used as a protective coat that is removed with a wet etch. In step 16, the process returns to the processes specific to the micromechanical structure being fabricated. Typically, this process will involve removing the sacrificial layer thereby allowing the active elements of each machine to move freely. Additional processes may also take place to cover or protect various surfaces of the micromachines that were not exposed previous to removing the sacrificial layer, such as thin-film processes.

At step 18, one advantage of this process becomes readily apparent. The wafer is still intact, so the die registration is very precise. Also, this step allows the process operator to determine yield by ascertaining which chips are operational, to be noted for removal later. This can be accomplished on a standard multiprobe station.

Figure 2:
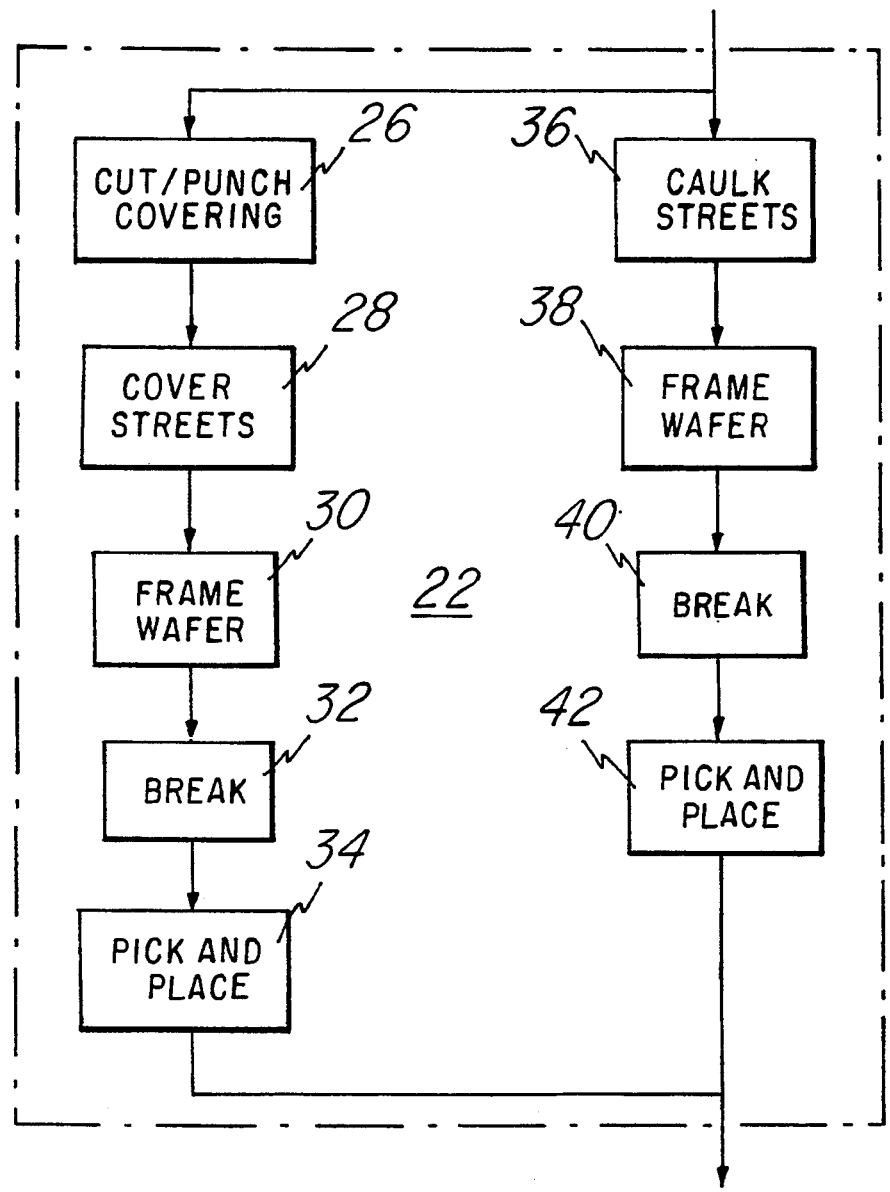
FIG. 2 shows a flow chart of one embodiment for the protecting step of the overall flow.

Step 22 in this diagram is stated very generally. An elaboration of the steps within the protection process of step 22 is shown in more detail in FIG. 2. Two possible options are shown. Step 26 would begin at the completion of step 18 from FIG. 1. A material to be used as tape is punched or cut with a pattern that matches the pattern of the streets on the wafer. A typical material could be mylar. The mylar would be treated with some type of adhesive, such as a UV or low-pressure sensitive adhesive. Then the process moves to step 28, in which the tape is aligned and applied to the wafer, completely covering the already partially sawn streets.

Figure 3A:
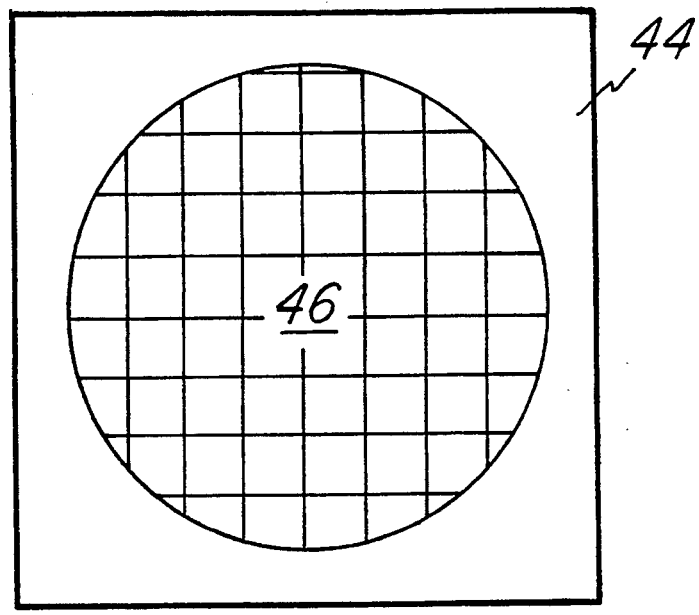
FIGS. 3a and 3b show an alignment for the placement of protective tape.
Figure 3B:
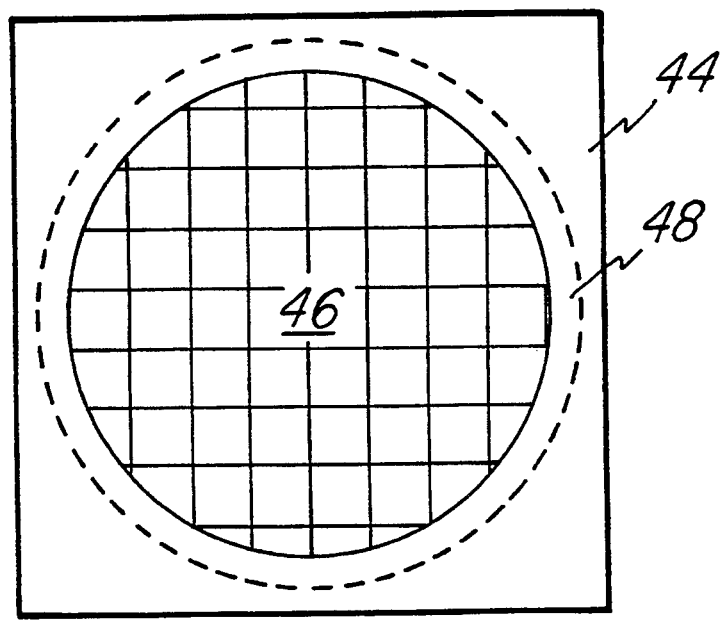

A graphic illustration of the alignment is shown in i FIGS. 3a and 3b. In FIG. 3a, the tape 44 is shown with its pattern punched. There is a hole 46 for the die. The grid represents places where the tape is left intact. In FIG. 3b, the dashed line 48 indicates the wafer's position after application of the tape.

In this embodiment, the wafer is then mounted on a frame for a commercially available wafer breaking machine in step 30. Further elaborations on a technique for breaking will be discussed in FIGS. 5a and 5b. Other possible embodiments could include rolling the wafer across the surface of a drum, breaking the wafer as it tries to bend to the curvature of the drum.

During the breaking process in step 32, the tape over the streets traps any debris from the break and prevents it from contaminating the active parts of the micromachines. Regardless of which breaking technique is used, when the wafer is broken, the adhesive on the tape is weakened, such as that treated with UV light, the tape is peeled away, and the chips can be removed by standard semiconductor machines which handle picking and placing of individual chips, in step 34.

An alternate method begins at the same point as the above process, just after the completion of step 18 from FIG. 1. Precision injection tools are fully capable of applying a protective material, such as a resist, to the streets in exact amounts. A side view of a wafer with caulking in partially sawn streets is shown in FIG. 4. The wafer 48, has partially sawn streets 50. The caulking material 52 is injected so as to not overfill the streets and approach the edge of the active areas of the chips. The caulking material could then undergo a soft-hard bake, in which it is hardened for better structural integrity. Again, in this embodiment, framing the wafer for a commercial breaking machine is shown in step 38. When the wafer is broken in step 40, the caulking traps any debris that could have escaped and damaged the active areas of the micromechanical structures.

The material used as caulking may be left in place, depending on material. The required attributes for the material are that it does not generate any particles, especially over time, and that it does not outgas. These are important in all micromachines, but especially important for optical micromachines that are exposed to intense illumination, such as spatial light modulators. Particles can cause illumination scatter and micromechanical obstruction. An outgassed film can collect on micromechanical surface and can increase the stiction ("stickiness") coefficient between two surfaces. Additionally, if the micromachine is illuminated through a window, such as some closed-package spatial light modulators, the outgassed film can lower the illumination by obscuring the window. One possible caulking material is a silicon-based rubber.

After the chips are separated via a breaking process in step 40, the pick and place tool can remove the chips from the frame in step 42. This completes the protective process for certain methods of breaking. Another alternative method for breaking is shown if FIG. 5a and 5b. The breaking step can be in the process shown in FIG. 1, step 24, or a part of an entirely separate process that does not involve protecting the streets. The only step from the process of FIG. 1 is the partial saw at step 12, or some equivalent thereof.

FIG. 5a shows a side view of a wafer 48, on a saw frame 54. The wafer rests on wafer dicing tape 60, which could be any dicing tape typically used in semiconductor processing. Having completed all of the micromachine-specific processing, the wafer must now be broken. It is not necessary that the wafer be protected as previously discussed, although it would more than likely be desirable. The distance between the streets is X. A wedge piece 70, comprising a plurality of individual wedges 72, is used to provide a stress concentration point and push up at points every 2 X on the scribe lines, shown at points 56a and 56b. The wafer may also be pulled down against the wedge by a vacuum from underneath the wafer.

The wedge will cause the wafer to break in the pattern shown in FIG. 5b. Chips 48a and 48b will be separated by an upward break represented by the point 58a. Chips 48b and 48c will be separated by a downward break represented by the point 58b. After the wafer is broken, the wafer protective tape is treated to reduce its tackiness, for example with UV exposure if it is UV adhesive, and is removed. If a protective coating as discussed above was used, it may or may not be removed. Then standard semiconductor tools can be used to pick and place the individual chips off of the saw frame.

Although there has been described to this point particular embodiments of wafer-form processing for micromachines, it is not intended that such specific references be considered as limitations upon the scope of this invention except in-so-far as set forth in the following claims.

What is claimed is:

1. A process for a semiconductor wafer upon which are partially completed micromechanical structures, wherein said structures have been completed insofar as processing steps specific to said structure comprising:
   a. partially sawing streets in the wafer;
   b. covering said partially sawn streets with a protective material, such that said partially sawn streets are completely covered, but said protective material does not cover all of said wafer;
   c. processing said wafer with said partially sawn streets further as required to complete said micromechanical structures being fabricated, including removal of any sacrificial layers and thin-film processes; and
   d. breaking said wafer with said partially sawn streets after said processing step into individual chips.

2. The process of claim 1 wherein said covering step uses tape as protective material.

3. The process of claim 1 wherein said covering step uses caulking as protective material.

4. The process of claim 1 wherein said process also includes the step of removing the protective material after said wafer is broken.

5. The process of claim 1 wherein said covering step uses a material that does not generate particles or outgasses.

* * * * *